March 12, 1968 G. B. COTTRELL 3,373,378

PULSE WIDTH MODULATOR

Filed Feb. 15, 1965 2 Sheets-Sheet 1

INVENTOR
GEORGE B. COTTRELL

BY [signature]

ATTORNEY

March 12, 1968 G. B. COTTRELL 3,373,378

PULSE WIDTH MODULATOR

Filed Feb. 15, 1965 2 Sheets-Sheet 2

INVENTOR.
GEORGE B. COTTRELL

BY [signature]

ATTORNEY 3,373,378

Patented Mar. 12, 1968

3,373,378

PULSE WIDTH MODULATOR

George B. Cottrell, Dairy Valley, Calif., assignor to North American Rockwell Corporation, a corporation of Delaware Filed Feb. 15, 1965, Ser. No. 432,792

5 Claims. (Cl. 331—113)

ABSTRACT OF THE DISCLOSURE

A digital type servo control system in which a single stage multivibrator is caused to operate as an analog to digital converter producing input to output linearization. The multivibrator receives as inputs a pulse train of substantially constant frequency and amplitude and a differential analog signal corresponding to an error signal of the servo system. The single stage operates upon these two input signals to provide nonsymmetrical complementary square wave output signals of decreasing frequency for increasing input signal amplitude. The linearization technique also produces servo stabilization without additional circuitry or components.

This invention relates generally to an improved semiconductor servomechanism apparatus and relates more specifically to a new and improved transistorized pulse width modulating system.

Digital type servomechanisms usually employ analog-to-digital converters or pulse width modulators to transform information in analog signal form into digital signals which may be utilized more effectively to energize servo motors as DC torquer motors. Prior digital servo control systems utilizing pulse width modulators require many stages of electronics to condition input signals before they are able to drive any type of output transducer such as a torquer motor. The unique and novel pulse width modulator of the present invention utilizes a single stage operating as a quasi-linear analog-to-digital converter. This quasi-linear technique also produces servo stabilization without additional circuitry or components. The driving stage consisting of a power switching circuit and a transducer is normally connected to the element for driving heavy power loads as a torquer motor.

The stage receives as inputs two signals—one a negative pulse train of substantially constant frequency and amplitude, the other a differential analog signal corresponding to an error signal of the servo system. The stage operates upon these two input signals to provide nonsymmetrical complementary square wave output signals of decreasing frequency for increasing input signal amplitude. The square wave outputs of the stage are applied to the driving stage to control the direction and level of current to the servo torquer motor or any other type of output transducer that may be used.

It is, therefore, an object of this invention to provide a new and improved analog-to-digital converter.

Another object of this invention is the provision of a simplified pulse width modulator.

It is another object of this invention to provide a relatively low cost pulse width modulator.

A further object of this invention is to provide a pulse width modulator having servo stabilization without additional circuitry or components.

A still further object of this invention is to provide a pulse width modulator system of simplified design having the capability of delivering large amounts of power to a load.

These and other objects of the present invention will be apparent from the following description of the accompanying drawings which illustrate certain preferred embodiments thereof and wherein.

Figure 1:
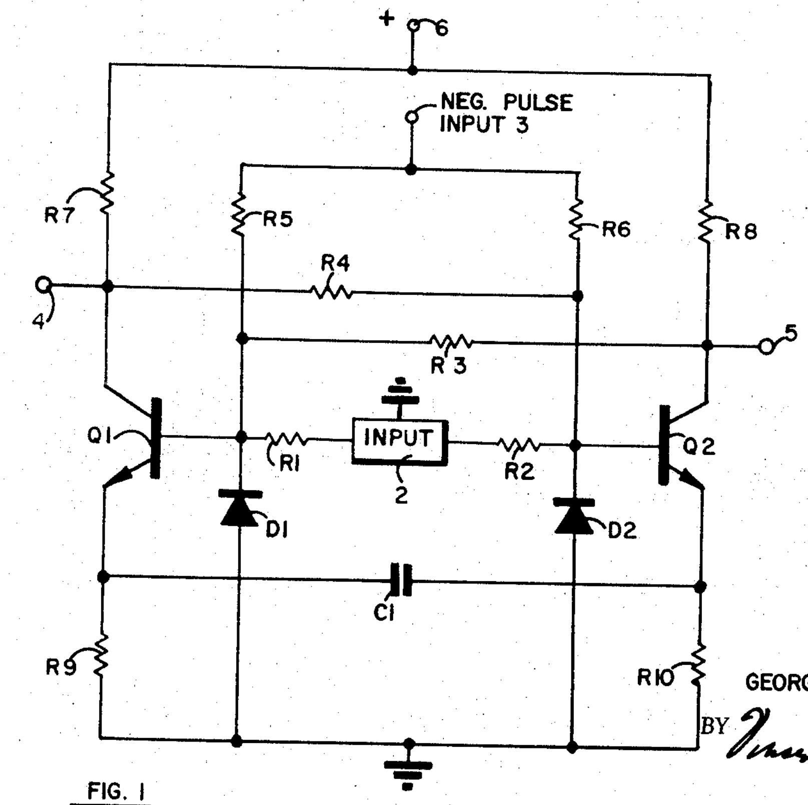
FIG. 1 illustrates a schematic diagram of a pulse width modulator embodying the invention.

Referring to FIG. 1, there is shown NPN transistors Q1 and Q2. Although NPN transistors are illustrated, it is to be understood that this invention is applicable with transistors of the opposite conductivity type with appropriate changes of potentials. The bases of Q1 and Q2 are connected by resistors R1 and R2, respectively, to the analog differential input means 2. The bases of Q1 and Q2 are also connected by means of diodes D1 and D2, respectively, to a point of reference potential illustrated as ground. Resistors R5 and R6 connect the bases of Q1 and Q2, respectively, to the negative pulse input terminal 3. The collector of Q1 is connected to output terminal 4 and by means of resistor R4 to the base of transistor Q2. The collector of transistor Q2 is connected to output terminal 5 and by means of resistor R3 to the base of transistor Q1. Resistors R7 and R8 connect the collectors of transistors Q1 and Q2 to the positive D.C. supply voltage terminal 6. Resistors R9 and R10 connect the emitters of transistors Q1 and Q2 to ground. Capacitor C1 connects the emitters of transistors Q1 and Q2.

Figure 2:
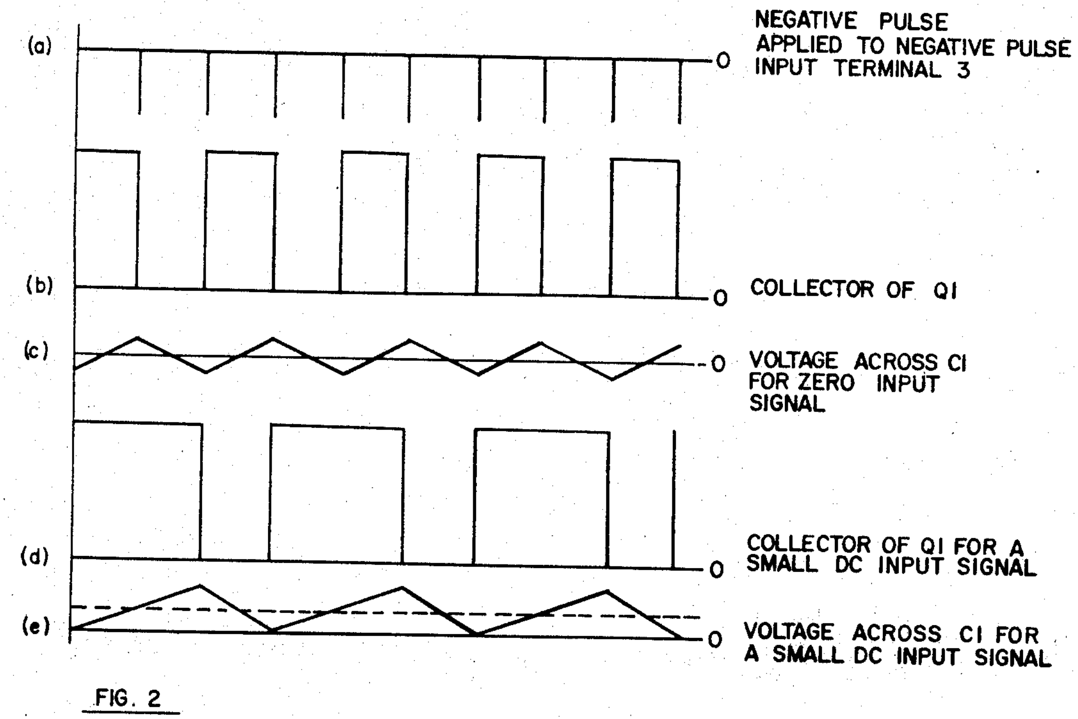
FIG. 2 illustrates wave forms occurring at various points of the embodiment illustrated in FIG. 1.

The circuit operates in the following manner:

Assuming the differential input signal to be zero, finite parameter variations will dictate that either transistor Q1 or transistor Q2 will saturate. Assume that transistor Q1 is turned on and saturated. The voltage across R9 rises rapidly charging C1 through R10. When a negative pulse, as shown in FIG. 2, Curve *a*, is applied through R5 and R6 to D1 and D2, D1 and D2 are forward biased sufficiently so that the base-emitter junction charges of transistor Q1 and transistor Q2 are erased and forced to be equally negative. At the termination of the negative pulse, Q1 would undoubtedly re-saturate but for the charge stored in C1. As C1 starts to discharge through R9 and R10, the polarities generated across R9 and R10 result in the turn-on of Q2. When Q2 turns on, capacitor C1 is rapidly charged through R9 by the voltage across R10. Subsequent negative pulses alternately cause Q1 and Q2 to toggle on, as shown for the collector of Q1 in FIG. 2, Curve *b*. The average charge of C1 is zero, as shown in FIG. 2, Curve *c*, when the differential input signal is zero.

If a differential input signal is applied, it will be algebraically added to the voltage across R9 and R10 producing base-emitter voltage for Q1 and Q2. If the input and capacitor discharge polarities are, for example, plus on the R2 side and minus on the R1 side, and minus on the emitter junction of Q2 and plus at the emitter junction of Q1, it can be seen that Q2 may turn on repeatedly. The repeated turn-on of the same transistor will cause the capacitor C1 to assume an average charge not zero, as shown in FIG. 2, Curve *e*, but related to the input signal amplitude. The average charge on C1, Curve *e*, is shown to be positive with respect to the zero voltage reference axis. This condition occurs with a positive input signal on the base of Q2. If the differential input signal were reversed, so that a negative signal would appear on the base of Q2 and the positive signal appears at the base of Q1, the average charge of C1 would be negative and appear displaced below the zero voltage reference axis an amount proportional to the differential input signal. Eventually this charge will insure that the unsaturated transistor will toggle unless the input signal is large enough to cause over-all circuit saturation. The output then at the collectors of the multivibrator are complementary symmetrical square waves for a zero input signal and nonsymmetrical complementary square waves of decreasing frequency for increasing input signal amplitudes, as shown for the collector of Q1 in FIG. 2, Curve *d*.

Figure 3:
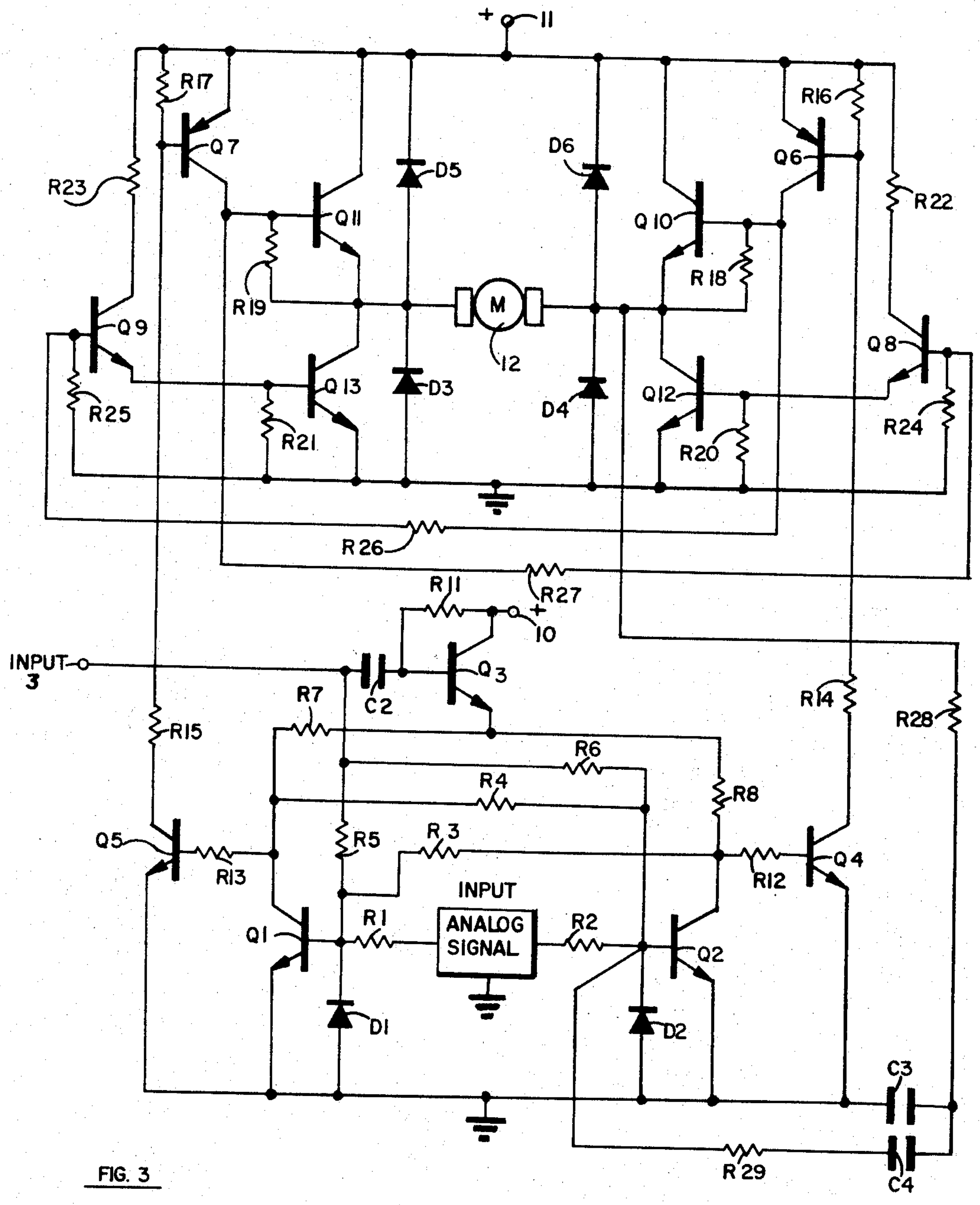
FIG. 3 illustrates a schematic diagram of another pulse width modulator embodying the invention.

A pulse width modulator using a slightly modified form of the bi-stable multivibrator illustrated in FIG. 1 is shown in FIG. 3. Referring to that figure, the collectors of transistors Q1 and Q2 are connected by resistors R7 and R8 to the emitter of transistor Q3. The base of transistor Q3 is connected by capacitor C2 to the negative pulse input terminal 3, and by resistor R11 to the collector of Q3 and to the positive DC supply terminal 10. Transistor Q3 upon receiving the negative pulse present on the negative pulse input terminal disconnects the positive DC supply from the collectors of transistors Q1 and Q2 and insures that their collectors are below ground potential. The emitters of transistors Q4 and Q5 are connected to ground. The bases of transistors Q4 and Q5 are connected by means of resistors R12 and R13 to the collectors of transistors Q2 and Q1, respectively. The collector of transistor Q5 is connected by means of resistor R15 to the base of transistor Q7. The collector of transistor Q4 is connected by means of resistor R14 to the base of transistor Q6. The bases of PNP transistors Q6 and Q7 are connected by means of resistors R16 and R17, respectively, to the positive DC supply terminal 11. The emitters of Q6 and Q7 and the collectors of Q10 and Q11 are connected directly to supply terminal 11. The collectors of Q8 and Q9 are connected by means of resistors R22 and R23, respectively, to supply terminal 11. The collectors of Q6 and Q7 are connected to the bases of Q10 and Q11 respectively. The base and emitter junctions of Q10, Q11, Q12 and Q13 are connected by means of resistors R18, R19, R20 and R21, respectively. The emitter junctions of Q12 and Q13 are connected to ground. The bases of transistors Q8 and Q9 are connected to ground by resistors R24 and R25, respectively. The base of Q9 is connected to the collector of Q6 by means of resistor R26. The base of Q8 is conected to the collector of Q7 by means of resistor R27. Diodes D6, D5, D4 and D3 are connected across the emitter-collector junctions of transistors Q10, Q11, Q12 and Q13, respectively. The load 12 which is illustrated as an electrical motor, but which may be a resistive, inductive or other type load, is connected between the emitters of transistors Q11 and Q10. The emitter of Q10 is connected to ground by the series circuit consisting of resistor R28 and capacitor C3. The junction of resistor R28 and capacitor C3 is connected to the base of transistor Q2 by means of the series connection of resistor R29 and capacitor C4.

Transistors Q1 and Q2 and the associated circuitry constitute a multivibrator. In operation, assuring that the differential analog input signal is zero, the following conditions prevail. Instantaneously either Q1 or Q2 will saturate due to finite circuit parameter variations in the multivibrator symmetry. Then the Q2 collector will rise towards the positive voltage on terminal 10 and Q4 will saturate which in turn saturates transistor Q6. The Q6 collector rises towards the positive voltage on terminal 11 forcing the Q10 emitter to follow. At the same time Q9, whose base is driven by the Q6 collector through resistor R22, saturates Q13. Since Q10 and Q13 are both "on", current flow through the load produces a minus polarity at the emitter of transistor Q11 and a plus polarity at the emitter of transistor Q10. This state will be maintained until a negative pulse occurs at the negative pulse input terminal 3. Then, through C2, Q3 is turned "off" and the collectors of Q1 and Q2 are driven to zero or a slightly negative potential. Simultaneously, through R5 and R6, D1 and D2 are forward biased sufficiently to erase the base-emitter storage charge of Q1 and Q2. At the termination of the negative pulse, Q1 would probably saturate again except for the energy stored in the motor load 12. However, motor flux collapsing due to the negative pulse causes the motor voltage to reverse. The lag network, consisting of R28 and C3, integrates the square wave at the motor and applies the resulting triangle wave through R29 and C4 to the base of Q2. Phase relations are such that at the time of the pulse the triangle is at its maximum positive potential. This potential though greatly attenuated by the network ensures that Q2 will saturate instead of Q1. Transistor Q2 in turn will cause Q11 and Q12 to saturate through logic identical to that previously described. When the next negative pulse occurs. Q1 will again be favored; the result being a symmetrical square wave across the motor load at one-half the negative pulse frequency.

If a low frequency input signal of small amplitude is applied, either Q1 or Q2 (depending upon the input polarity) may turn on repeatedly. The average value of the charge on C3 will follow the low frequency variation and cause Q2 to toggle in the case where Q1 is repeating and also will cause Q1 to toggle when Q2 is repeating. If the input is DC, the presence of C4 will eventually lead to either Q1 or Q2 (depending upon input polarity) remaining on continuously for practically any input amplitude. Inserting the pulse width modulator in a closed loop control system results in a stable system or not depending upon the the nature of the load and the transducer producing the input signal.

A second order control system which is not capable of extremely high frequency servo natural frequency requires an integration to obtain a high DC gain and a derivative signal to afford stability at the servo natural frequency. One method of obtaining the desired frequency response is to provide compensation in the feedback path as is done in this pulse width modulator. The servo error signal is contained in the digitized voltage applied to the motor 12 and can be recovered by filtering through a single RC integration by means well known to those persons skilled in the art. If the integration break frequency is chosen such that the appreciable lag occurs at the servo natural frequency, the lag produced in the feedback path will prove to be a derivative signal for servo stabilization. Moreover, the presence of C4 prohibits the feedback of any DC value which to the closed loop system is an integration producing high DC gain.

The feedback network consisting of R28, C3, C4 and R29 performs the functions of: providing the toggle signal for the bi-stable multivibrator, thus linearizing the multivibrator input-output transfer function; providing a derivative signal to the closed loop system; and providing an integration for the closed loop system.

This pulse width modulator can be driven from any analog type input. With slight modification to the input circuitry, it can also be driven directly from a differential type capacitive pickoff. The particular embodiment shown employs thirteen transistors and is capable of delivering over 50 watts of power to the motor load. Where only one watt or less is required, the number of transistors can be reduced to nine if a bridge output is used and to seven if one-half bridge is used.

The following are representative values of the components used in the pulse width modulator:

*Resistors*

| | Ohms |
|---|---|
| 1, 2, 11 | 50K |
| 3, 4, 28 | 30K |
| 5, 6, 7, 8, 12, 13, 14, 15 | 10K |
| 9, 10 | 100 |
| 16, 17 | 1000 |
| 18, 19, 20, 21 | 500 |
| 22, 23, 24, 25 | 2K |
| 26, 27 | 5K |
| 29 | 3K |

*Capacitors*

| | μfd. |
|---|---|
| C1 | 1 |
| C2 | .1 |
| C3 | 10 |
| C4 | 4 |

*Transistors*

| | |
|---|---|
| Q1, Q2 | 2N706 |
| Q3, Q4, Q5, Q8, Q9 | 2N1613 |
| Q6, Q7 | 2N1132 |
| Q10, Q11, Q12, Q13 | 2N3054 |

*Diodes*

| | |
|---|---|
| D1, D2 | 1N645 |
| D3, D4, D5, D6 | 1N485 |

While there has been shown what are considered to be the preferred embodiments of the invention, it will be manifest that many changes and modifications may be made therein without departing from the essential spirit of the invention. It is intended, therefore, in the annexed claims to cover all such changes and modifications as fall within the true scope of the invention.

I claim:

1. Semiconductor control apparatus, comprising:
a multivibrator provided with a first and second transistor, each having base, emitter and collector electrodes and biasing circuits therefor;
resistive means including a first resistor connecting the base of said first transistor to the collector of said second transistor and a second resistor connecting the base of said second transistor to the collector of said first transistor;
means for applying a differential input signal to the bases of said transistors;
means for providing a pulse train to both of said bases tending to turn both said transistors off, said pulse train having a substantially constant amplitude and frequency;
a load connected to the collector terminals of said transistors;
means for sensing the voltage present on said collectors and for providing control pulses proportional to the sensed voltage;
switch means connected to said load and responsive to said control pulses for providing a current flow through said load, said current flow being a function of said sensed voltage.

2. The apparatus, as claimed in claim 1, and further comprising feedback means connected between said load and the base of said first transistor.

3. The apparatus, as claimed in claim 2, wherein said feedback means includes an integrator.

4. A pulse width modulator comprising:
first and second transistors, each provided with a collector, an emitter and a base;
a first resistor connecting the base of said first transistor to the collector of said second transistor;
a second resistor connecting the base of said second transistor to the collector of said first transistor;

means for applying a constant potential to the collectors of said transistors relative to the emitters thereof;
means for applying pulses of constant frequency to the bases of both said transistors, said pulses having a polarity for turning off said transistors;
energy storage means connecting the emitters of said first and second transistors, said energy storage means being operative subsequent to the application of each of said constant frequency pulses to render one of said transistors non-conductive and the other of said transistors conductive during the interval between each of said constant frequency pulses, the states of conductivity of said first and second transistors being reversed subsequent to the application of each of said constant frequency pulses; and
means connected between the bases of said first and second transistors for providing a complementary modulating signal to said bases, so as to vary the "off" time of said transistors.

5. A transistor pulse width modulator comprising a multivibrator having first and second transistors each provided with a collector, an emitter and a base;
a first resistor connecting the base of said first transistor to the collector of said second transistor;
a second resistor connecting the base of said second transistor to the collector of said first transistor;
a capacitor connecting the emitters of said first and second transistors;
a common terminal;
third and fourth resistors connecting the emitters of said first and second transistors, respectively, to said common terminal;
first and second diodes connecting the base of said first and second transistors, respectively, to said common terminal;
a positive voltage terminal;
fifth and sixth resistors connecting the collector of said first and second transistors, respectively, to said voltage terminal;
a source of voltage connected between said positive voltage terminal and said common terminal;
a negative pulse input terminal;
seventh and eighth resistors connecting the base of said first and second transistors, respectively, to said negative pulse input terminal;
a source of negative pulses of substantially constant frequency connected to said pulse input terminal;
means for applying a complementary modulating signal connected by a ninth and tenth resistor to the base of said first and second transistors, respectively.

References Cited

UNITED STATES PATENTS

| | | | |
|---|---|---|---|
| 2,418,268 | 4/1947 | Lawson | 332—14 |
| 2,432,204 | 12/1947 | Miller | 332—14 |
| 2,750,502 | 6/1956 | Gray | 332—14 |
| 3,077,567 | 2/1963 | Gray | 331—113 |
| 3,201,602 | 8/1965 | Norwalt | 307—88.5 |

JOHN KOMINSKI, *Primary Examiner.*